(12) United States Patent
Choi

(10) Patent No.: US 11,742,035 B2
(45) Date of Patent: Aug. 29, 2023

(54) MEMORY DEVICE INCLUDING BIT LINE PRECHARGE OPERATION DURING PROGRAM VERIFY OPERATION

(71) Applicant: SK hynix Inc., Icheon-si (KR)

(72) Inventor: Hyung Jin Choi, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/183,955

(22) Filed: Feb. 24, 2021

(65) Prior Publication Data

US 2022/0059174 A1 Feb. 24, 2022

(30) Foreign Application Priority Data

Aug. 20, 2020 (KR) ........................ 10-2020-0104937

(51) Int. Cl.
| | |
|---|---|
| *G11C 16/34* | (2006.01) |
| *G11C 16/10* | (2006.01) |
| *G11C 16/24* | (2006.01) |
| *G11C 16/08* | (2006.01) |
| *G11C 16/26* | (2006.01) |
| *G11C 16/14* | (2006.01) |

(52) U.S. Cl.
CPC .......... *G11C 16/3459* (2013.01); *G11C 16/08* (2013.01); *G11C 16/10* (2013.01); *G11C 16/102* (2013.01); *G11C 16/14* (2013.01); *G11C 16/24* (2013.01); *G11C 16/26* (2013.01); *G11C 16/3404* (2013.01)

(58) Field of Classification Search
None
See application file for complete search history.

(56) References Cited

U.S. PATENT DOCUMENTS

| | | | | |
|---|---|---|---|---|
| 5,831,900 A | * | 11/1998 | Miyamoto | G11C 7/1039 365/185.23 |
| 2006/0209592 A1 | * | 9/2006 | Li | G11C 11/5642 365/185.03 |
| 2007/0171711 A1 | * | 7/2007 | Kang | G11C 11/5642 365/185.03 |
| 2011/0280083 A1 | * | 11/2011 | Choi | G11C 16/3454 365/185.22 |

FOREIGN PATENT DOCUMENTS

| | | |
|---|---|---|
| KR | 101197478 B1 | 11/2012 |
| KR | 101662277 B1 | 10/2016 |

\* cited by examiner

*Primary Examiner* — J. H. Hur
(74) *Attorney, Agent, or Firm* — William Park & Associates Ltd.

(57) ABSTRACT

A memory device may include a plurality of memory cells, a peripheral circuit, and control logic. The peripheral circuit is configured to perform a program verify operation for a target program state among a plurality of program states on selected memory cells among the plurality of memory cells. The control logic is configured to control the peripheral circuit to precharge bit lines coupled to first memory cells among the selected memory cells and bit lines coupled to second memory cells among the selected memory cells in the program verify operation. The first memory cells are program-passed memory cells among memory cells programmed to a program state higher than the target program state among the plurality of program states. The second memory cells are memory cells programmed to a program state lower than or equal to the target program state among the plurality of program states.

14 Claims, 11 Drawing Sheets

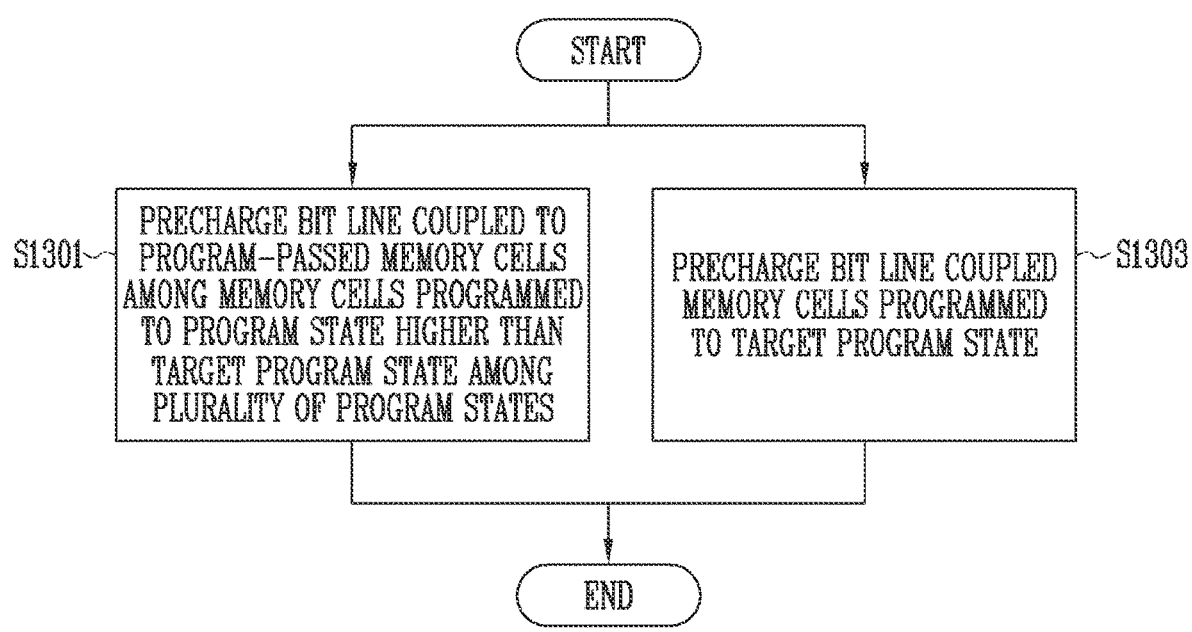

MEMORY DEVICE INCLUDING BIT LINE PRECHARGE OPERATION DURING PROGRAM VERIFY OPERATION

CROSS-REFERENCE TO RELATED APPLICATION

The present application claims priority under 35 U.S.C. § 119(a) to Korean patent application number 10-2020-0104937 filed on Aug. 20, 2020, in the Korean Intellectual Property Office, the entire disclosure of which is incorporated by reference herein.

BACKGROUND

1. Technical Field

The present disclosure generally relates to an electronic device, and more particularly, to a memory device and an operating method thereof.

2. Related Art

A storage device is a device which stores data under the control of a host device such as a computer or a smart phone. The storage device may include a memory device for storing data and a memory controller for controlling the memory device. The memory device is classified as a volatile memory device or a nonvolatile memory device.

A volatile memory device is a memory device in which data is stored only when power is supplied, and the stored data is lost when the supply of power is interrupted. A volatile memory device may include Static Random Access Memory (SRAM), Dynamic Random Access Memory (DRAM), and the like.

A nonvolatile memory device is a memory device in which data is retained even when a supply of power is interrupted. A nonvolatile memory device may include Read Only Memory (ROM), Programmable ROM (PROM), Electrically Programmable ROM (EPROM), Electrically Erasable ROM (EEROM), flash memory, and the like.

SUMMARY

Some embodiments are directed to a memory device having improved program verify operation performance and an operating method of the memory device.

In accordance with an embodiment of the present disclosure, a memory device includes: a plurality of memory cells; a peripheral circuit configured to perform a program verify operation for a target program state among a plurality of program states on selected memory cells among the plurality of memory cells; and control logic configured to control the peripheral circuit to precharge bit lines coupled to first memory cells among the selected memory cells and bit lines coupled to second memory cells among the selected memory cells in the program verify operation. The first memory cells are program-passed memory cells among memory cells programmed to a program state higher than the target program state among the plurality of program states, and the second memory cells are memory cells programmed to a program state lower than or equal to the target program state among the plurality of program states.

In accordance with another embodiment of the present disclosure, a memory device includes: a plurality of memory cells; a peripheral circuit configured to perform a program verify operation for a target program state among a plurality of program states on selected memory cells among the plurality of memory cells; and control logic configured to control the peripheral circuit to precharge bit lines coupled to first memory cells among the selected memory cells and bit lines coupled to second memory cells among the selected memory cells in the program verify operation. The first memory cells are program-passed memory cells among memory cells programmed to the other program states except the target program state among the plurality of program states, and the second memory cells are memory cells programmed to the target program state.

In accordance with still another embodiment of the present disclosure is a method for operating a memory device including a plurality of memory cells. The method includes performing a bit line precharge operation of precharging bit lines coupled to first and second memory cells included in selected memory cells among the plurality of memory cells, and performing an evaluation operation of sensing a potential of bit lines coupled to the selected memory cells. The first memory cells are program-passed memory cells among memory cells programmed to a program state higher than a target program state among a plurality of program states, and the second memory cells are memory cells programmed to a program state lower than or equal to the target program state among the plurality of program states.

In accordance with still another embodiment of the present disclosure is a method for operating a memory device including a plurality of memory cells. The method includes performing a bit line precharge operation of precharging bit lines coupled to first and second memory cells included in selected memory cells among the plurality of memory cells, and performing an evaluation operation of sensing a potential of bit lines coupled to the selected memory cells. The first memory cells are program-passed memory cells among memory cells programmed to the other program states except a target program state among a plurality of program states, and the second memory cells are memory cells programmed to the target program state.

BRIEF DESCRIPTION OF THE DRAWINGS

Example embodiments will now be described more fully hereinafter with reference to the accompanying drawings. Embodiments may be embodied in different forms and should not be construed as being limited to the example embodiments set forth herein. Rather, the example embodiments are provided so that this disclosure will be enabling to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIG. 13 is a flowchart illustrating an embodiment of the bit line precharge operation shown in FIG. 11.

DETAILED DESCRIPTION

The specific structural or functional descriptions disclosed herein are merely illustrative for the purpose of describing embodiments according to the concept of the present disclosure. Embodiments according to the concept of the present disclosure can be implemented in various forms, and should not be construed as being limited to the embodiments set forth herein.

Figure 1:
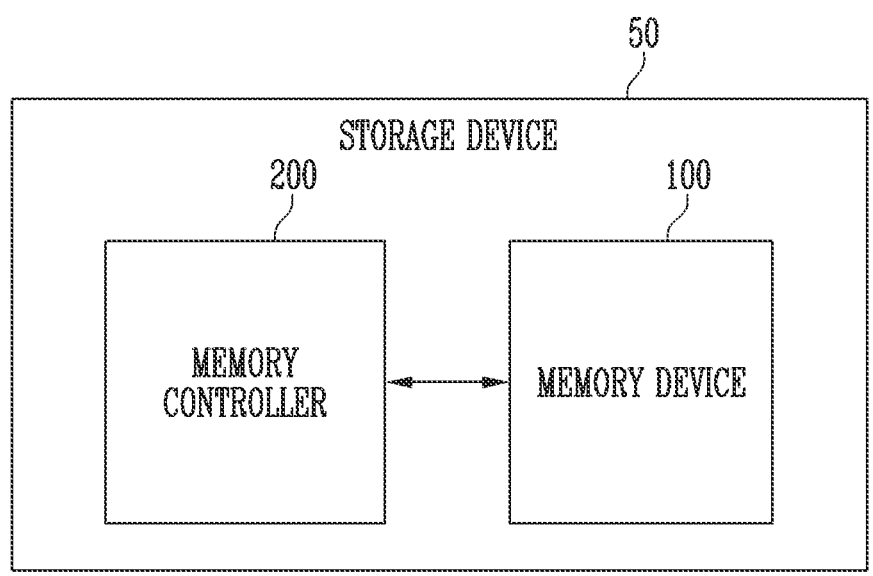
FIG. 1 is a diagram illustrating a storage device in accordance with an embodiment of the present disclosure.

FIG. 1 is a diagram illustrating a storage device 50 in accordance with an embodiment of the present disclosure.

Referring to FIG. 1, the storage device 50 may include a memory device 100 and a memory controller 200 configured to control an operation of the memory device 100. The storage device 50 may be a device for storing data under the control of a host, such as a mobile phone, a smart phone, an MP3 player, a laptop computer, a desktop computer, a game console, a TV, a tablet PC, or an in-vehicle infotainment.

The storage device 50 may be manufactured as any one of various types of storage devices according to a host interface that is a communication scheme with the host. For example, the storage device 50 may be implemented with any one of a variety of types of storage devices, such as a Solid State Drive (SSD), a Multi-Media Card (MMC), an Embedded MMC (eMMC), a Reduced Size MMC (RS-MMC), a micro-MMC (micro-MMC), a Secure Digital (SD) card, a mini-SD card, a micro-SD card, a Universal Serial Bus (USB) storage device, a Universal Hash Storage (UFS) device, a Compact Flash (CF) card, a Smart Media Card (SMC), a memory stick, and the like.

The storage device 50 may be manufactured as any one of various kinds of package types. For example, the storage device 50 may be manufactured as a Package-On-Package (POP), a System-In-Package (SIP), a System-On-Chip (SOC), a Multi-Chip Package (MCP), a Chip-On-Board (COB), a Wafer-level Fabricated Package (WFP), and a Wafer-level Stack Package (WSP).

The memory device 100 may store data. The memory device 100 operates under the control of the memory controller 200. The memory device 100 may include a memory cell array including a plurality of memory cells for storing data.

Each of the memory cells may be configured as a Single-Level Cell (SLC) storing one data bit, a Multi-Level Cell (MLC) storing two data bits, a Triple-Level Cell (TLC) storing three data bits, or a Quad-Level Cell (QLC) storing four data bits.

The memory cell array may include a plurality of memory blocks. Each memory block may include a plurality of memory cells. One memory block may include a plurality of pages. In an embodiment, the page may be a unit for storing data in the memory device 100 or reading data stored in the memory device 100.

The memory block may be a unit for erasing data. In an embodiment, the memory device 100 may include Double Data Rate Synchronous Dynamic Random Access Memory (DDR SDRAM), Low Power Double Data Rate 4 (LPDDR4) SDRAM, Graphics Double Data Rate (GDDR) SRAM, Low Power DDR (LPDDR), Rambus Dynamic Random Access Memory (RDRAM), NAND flash memory, vertical NAND flash memory, NOR flash memory, Resistive Random Access Memory (RRAM), Phase-Change Random Access Memory (PRAM), Magnetoresistive Random Access Memory (MRAM), Ferroelectric Random Access Memory (FRAM), Spin Transfer Torque Random Access Memory (STT-RAM), or the like. In this specification, for convenience of description, a case where the memory device 100 includes NAND flash memory is assumed and described.

The memory device 100 receives a command and an address from the memory controller 200 and accesses an area selected by the address in the memory cell array. That is, the memory device 100 may perform an operation instructed by the command on the area selected by the address. For example, the memory device 100 may perform a write (program) operation, a read operation, or an erase operation. In the program operation, the memory device 100 may program data in the area selected by the address. In the read operation, the memory device 100 may read data from the area selected by the address. In the erase operation, the memory device 100 may erase data stored in the area selected by the address.

The memory controller 200 may control overall operations of the storage device 50.

When power is applied to the storage device 50, the memory controller 200 may execute firmware (FW). When the memory device 100 is a flash memory device, the memory controller 200 may execute FW such as a Flash Translation Layer (FTL) for controlling communication between the host and the memory device 100.

In an embodiment, the memory controller 200 may receive data and a Logical Block Address (LBA) from the host, and translate the LBA into a Physical Block Address (PBA) representing addresses of memory cells included in the memory device 100, in which data is to be stored.

The memory controller 200 may control the memory device 100 to perform a program operation, a read operation, an erase operation, or the like in response to a request from the host. In the program operation, the memory controller 200 may provide a program command, a PBA, and data to the memory device 100. In the read operation, the memory controller 200 may provide a read command and a PBA to the memory device 100. In the erase operation, the memory controller 200 may provide an erase command and a PBA to the memory device 100.

In an embodiment, the memory controller 200 may autonomously generate a command, an address, and data regardless of any request from the host, and transmit the command, the address, and the data to the memory device 100. For example, the memory controller 200 may provide the command, the address, and the data to the memory device 100 to perform background operations such as a program operation for wear leveling and a program operation for garbage collection.

In an embodiment, the memory controller 200 may control at least two memory devices 100. The memory controller 200 may control the memory devices according to an interleaving scheme so as to improve operational performance. The interleaving scheme may be an operating scheme that allows operation periods of at least two memory devices 100 to overlap with each other.

The host may communicate with the storage device 50, using at least one of various communication schemes, such as a Universal Serial bus (USB), a Serial AT Attachment (SATA), a High Speed InterChip (HSIC), a Small Computer System Interface (SCSI), Firewire, a Peripheral Component Interconnection (PCI), a PCI express (PCIe), a Non-Volatile Memory express (NVMe), a universal flash storage (UFS), a Secure Digital (SD), a Multi-Media Card (MMC), an embedded MMC (eMMC), a Dual In-line Memory Module (DIMM), a Registered DIMM (RDIMM), and a Load Reduced DIMM (LRDIMM).

Figure 2:
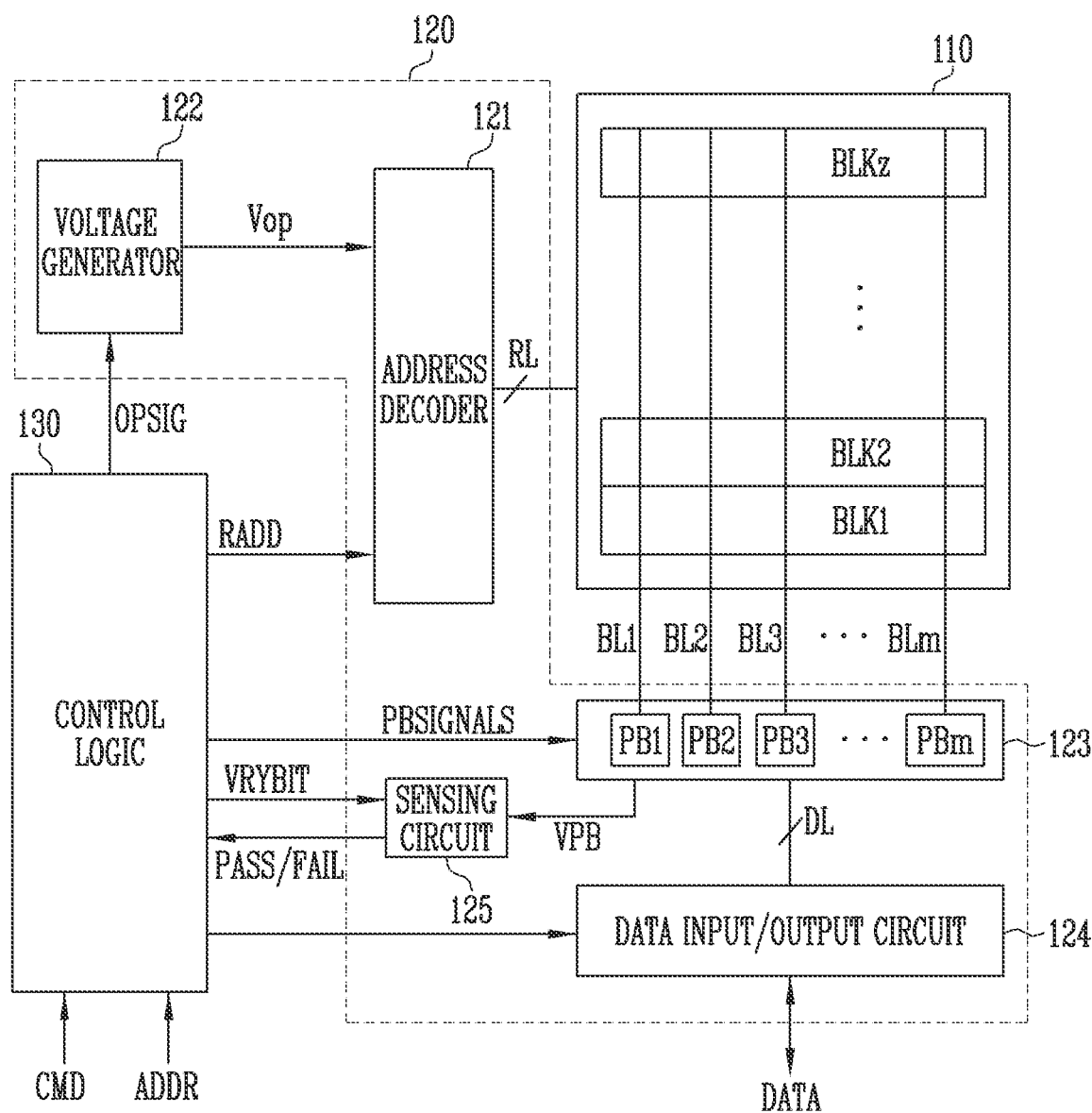
FIG. 2 is a diagram illustrating a structure of a memory device shown in FIG. 1.

FIG. 2 is a diagram illustrating a structure of the memory device 100 shown in FIG. 1.

Referring to FIG. 2, the memory device 100 may include a memory cell array 110, a peripheral circuit 120, and control logic 130.

The memory cell array 110 includes a plurality of memory blocks BLK1 to BLKz. The plurality of memory blocks BLK1 to BLKz are coupled to an address decoder 121 through row lines RL. The plurality of memory blocks BLK1 to BLKz are coupled to a read/write circuit 123 through bit lines BL1 to BLm. Each of the plurality of memory blocks BLK1 to BLKz includes a plurality of memory cells. In an embodiment, the plurality of memory cells may be nonvolatile memory cells. Memory cells coupled to the same word line among the plurality of memory cells may be defined as one physical page. That is, the memory cell array 110 may be configured with a plurality of physical pages. In accordance with an embodiment of the present disclosure, each of the plurality of memory blocks BLK1 to BLKz included in the memory cell array 110 may include a plurality of dummy cells. One or more dummy cells may be coupled in series between a drain select transistor and memory cells and between a source select transistor and the memory cells.

Each of the memory cells of the memory device may be configured as a Single-Level Cell (SLC) storing one data bit, a Multi-Level Cell (MLC) storing two data bits, a Triple-Level Cell (TLC) storing three data bits, or a Quad-Level Cell (QLC) storing four data bits.

The peripheral circuit 120 may include the address decoder 121, a voltage generator 122, the read/write circuit 123, a data input/output circuit 124, and a sensing circuit 125.

The peripheral circuit 120 drives the memory cell array 110. For example, the peripheral circuit 120 may drive the memory cell array 110 to perform a program operation, a read operation, and an erase operation.

The address decoder 121 is coupled to the memory cell array 110 through the row lines RL. The row lines RL may include drain select lines, word lines, source select lines, and a common source line. In accordance with an embodiment of the present disclosure, the word lines may include normal word lines and dummy word lines. In accordance with an embodiment of the present disclosure, the row lines RL may further include a pipe select line.

The address decoder 121 may operate under the control of the control logic 130. The address decoder 121 receives an address ADDR from the control logic 130.

The address decoder 121 may decode a block address in the received address ADDR. The address decoder 121 selects at least one memory block among the memory blocks BLK1 to BLKz according to the decoded block address. The address decoder 121 may decode a row address in the received address ADDR. The address decoder 121 may select at least one word line among word lines of the selected memory block according to the decoded row address. The address decoder 121 may apply an operating voltage Vop supplied from the voltage generator 122 to the selected word line.

In a program operation, the address decoder 121 may apply a program voltage to the selected word line, and apply a pass voltage having a level lower than that of the program voltage to unselected word lines. In a program verify operation, the address decoder 121 may apply a verify voltage to the selected word line, and apply a verify pass voltage having a level higher than that of the verify voltage to the unselected word lines.

In a read operation, the address decoder 121 may apply a read voltage to the selected word line, and apply a read pass voltage having a level higher than that of the read voltage to the unselected word lines.

In accordance with an embodiment of the present disclosure, an erase operation of the memory device 100 is performed in units of memory blocks. In an erase operation, the address ADDR input to the memory device 100 includes a block address. The address decoder 121 may decode the block address and select at least one memory block according to the decoded block address. In the erase operation, the address decoder 121 may apply a ground voltage to word lines coupled to the selected memory block.

In accordance with an embodiment of the present disclosure, the address decoder 121 may decode a column address in the address ADDR transmitted thereto. The decoded column address may be transmitted to the read/write circuit 123. In an example, the address decoder 121 may include components such as a row decoder, a column decoder, and an address buffer.

The voltage generator 122 may generate a plurality of operating voltages Vop by using an external power voltage supplied to the memory device 100. The voltage generator 122 operates under the control of the control logic 130.

In an embodiment, the voltage generator 122 may generate an internal power voltage by regulating the external power voltage. The internal power voltage generated by the voltage generator 122 is used as an operation voltage of the memory device 100.

In an embodiment, the voltage generator 122 may generate a plurality of operating voltages Vop by using the external power voltage or the internal power voltage. The voltage generator 122 may generate various voltages required by the memory device 100. For example, the voltage generator 122 may generate a plurality of erase voltages, a plurality of program voltages, a plurality of pass voltages, a plurality of select read voltages, and a plurality of unselect read voltages.

In order to generate a plurality of operating voltages Vop having various voltage levels, the voltage generator 122 may include a plurality of pumping capacitors for receiving the internal power voltage, and generate the plurality of operating voltages Vop by selectively activating the plurality of pumping capacitors under the control of the control logic 130.

The plurality of generated voltages Vop may be supplied to the memory cell array 110 by the address decoder 121.

The read/write circuit 123 includes first to mth page buffers PB1 to PBm. The first to mth page buffers PB1 to PBm are coupled to the memory cell array 110 through the respective first to mth bit lines BL1 to BLm. The first to mth page buffers PB1 to PBm operate under the control of the control logic 130.

The first to mth page buffers PB1 to PBm communicate data DATA with the data input/output circuit 124. In a program operation, the first to mth page buffers PB1 to PBm receive data DATA to be stored through the data input/output circuit 124 and data lines DL.

In a program operation, the first to mth page buffers PB1 to PBm may transfer, to selected memory cells through the bit lines BL1 to BLm, data DATA received through the data input/output circuit 124 when a program pulse is applied to a selected word line. The memory cells of the selected memory cells are programmed according to the transferred data DATA. A memory cell coupled to a bit line through which a program allow voltage (e.g., a ground voltage) is applied may have an increased threshold voltage. A threshold voltage of a memory cell coupled to a bit line through which a program inhibit voltage (e.g., a power voltage) is applied may be maintained. In a program verify operation, the first to mth page buffers PB1 to PBm read data DATA stored in the selected memory cells from the selected memory cells through the bit lines BL1 to BLm.

In a read operation, the read/write circuit 123 may read data DATA from memory cells of a selected page through the bit lines BL, and store the read data DATA in the first to mth page buffers PB1 to PBm.

In an erase operation, the read/write circuit 123 may float the bit lines BL. In an embodiment, the read/write circuit 123 may include a column select circuit.

The data input/output circuit 124 is coupled to the first to mth page buffers PB1 to PBm through the data lines DL. The data input/output circuit 124 operates under the control of the control logic 130.

The data input/output circuit 124 may include a plurality of input/output buffers (not shown) that receive input data DATA. In a program operation, the data input/output circuit 124 may receive data DATA to be stored from an external controller (not shown). In a read operation, the data input/output circuit 124 outputs, to the external controller, data transmitted from the first to mth page buffers PB1 to PBm included in the read/write circuit 123.

In a read operation or verify operation, the sensing circuit 125 may generate a reference current in response to an allow bit VRYBIT signal generated by the control logic 130, and output a pass signal or fail signal to the control logic 130 by comparing a sensing voltage VPB received from the read/write circuit 123 and a reference voltage generated by the reference current.

The control logic 130 may be coupled to the address decoder 121, the voltage generator 122, the read/write circuit 123, the data input/output circuit 124, and the sensing circuit 125. The control logic 130 may be implemented as hardware, software, or a combination of hardware and software. For example, the control logic 130 may be a control logic circuit operating in accordance with an algorithm and/or a processor executing control logic code. The control logic 130 may control overall operations of the memory device 100. The control logic 130 may operate in response to a command CMD transferred from an external device.

The control logic 130 may control the peripheral circuit 120 by generating several signals in response to a command CMD and an address ADDR. For example, the control logic 130 may generate an operation signal OPSIG, a row address RADD, a read/write circuit control signal PBSIGNALS, and an allow bit VRYBIT in response to the command CMD and the address ADDR. The control logic 130 may output the operation signal OPSIG to the voltage generator 122, output the row address RADD to the address decoder 121, output the read/write circuit control signal PBSIGNALS to the read/write circuit 123, and output the allow bit VRYBIT to the sensing circuit 125. Also, the control logic 130 may determine whether the verify operation has passed or failed in response to the pass or fail signal PASS/FAIL output by the sensing circuit 125.

In an embodiment, the peripheral circuit 120 may perform a program verify operation for a target program state among a plurality of program states on selected memory cells among a plurality of memory cells. The target program state may be a program state in which a current program loop among the plurality of program states is being performed.

In an embodiment, in the program verify operation, the control logic 130 may control the peripheral circuit 120 to precharge bit lines coupled to first memory cells and bit lines coupled to second memory cells among the selected memory cells.

In an embodiment, the first memory cells may be program-passed memory cells among memory cells programmed to a program state higher than the target program state among the plurality of program states. The second memory cells may be memory cells programmed to a program state lower than or equal to the target program state among the plurality of program states.

In an embodiment, the first memory cells may be program-passed memory cells among memory cells programmed to the other program states except the target program state among the plurality of program states. The second memory cells may be memory cells programmed to the target program state.

After the control logic 130 precharges the bit lines coupled to the first memory cells and the bit lines coupled to the second memory cells, the control logic 130 may control the peripheral circuit 120 to perform an evaluation operation of sensing a potential of bit lines coupled to the selected memory cells.

During the evaluation operation, the control logic 130 may control the peripheral circuit 120 to apply a verify voltage to a word line coupled to the selected memory cells among the plurality of memory cells and to apply a verify pass voltage to word lines coupled to unselected memory cells among the plurality of memory cells.

The control logic 130 may compare a threshold voltage of memory cells to be programmed to the target program state among the selected memory cells with the verify voltage, based on a result of the evaluation operation. The control logic 130 may determine whether the program verify operation for the target program state has passed or failed, based on a comparison result.

Figure 3:
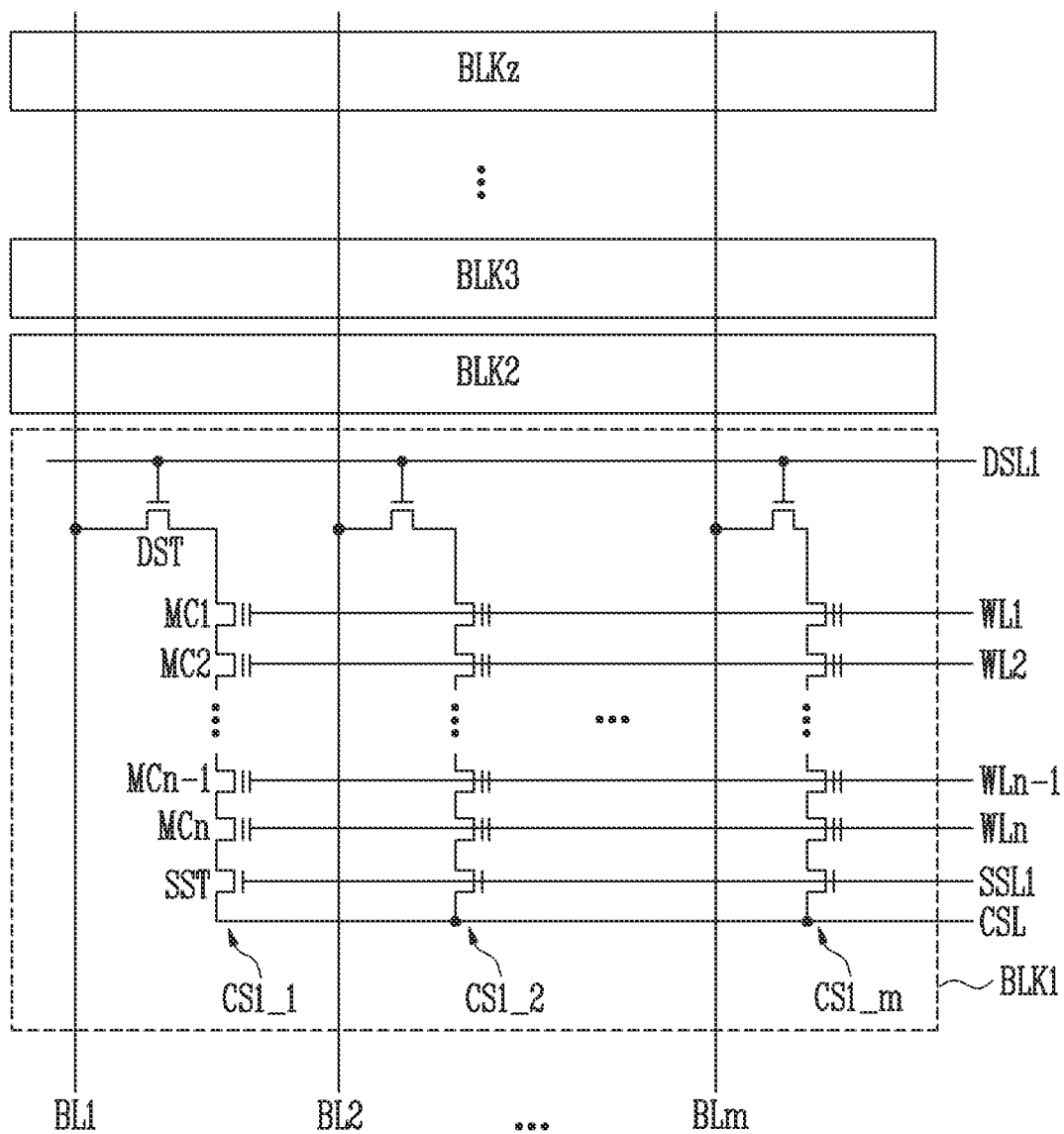
FIG. 3 is a diagram illustrating an embodiment of a memory cell array shown in FIG. 2.

FIG. 3 is a diagram illustrating an embodiment of the memory cell array 110 shown in FIG. 2.

Referring to FIG. 3, first to zth memory blocks BLK1 to BLKz are commonly coupled to the first to mth bit lines BL1 to BLm. In FIG. 3, for convenience of description, components included in the first memory block BLK1 among the plurality of memory blocks BLK1 to BLKz are illustrated, and components included in each of the other memory blocks BLK2 to BLKz are omitted. It will be understood that each of the other memory blocks BLK2 to BLKz is configured identically to the first memory block BLK1.

The memory block BLK1 may include a plurality of cell strings CS1_1 to CS1_$m$ ($m$ is a positive integer). First to mth cell strings CS1_1 to CS1_$m$ are respectively coupled to the first to mth bit lines BL1 to BLm. Each of the first to mth cell strings CS1_1 to CS1_m includes a drain select transistor DST, a plurality of memory cells MC1 to MCn (n is a positive integer) coupled in series, and a source select transistor SST.

A gate terminal of the drain select transistor DST included in each of the first to mth cell strings CS1_1 to CS1_m is coupled to a drain select line DSL1. Gate terminals of first to nth memory cells MC1 to MCn included in each of the first to mth cell strings CS1_1 to CS1_m are respectively coupled to first to nth word lines WL1 to WLn. A gate terminal of the source select transistor SST included in each of the first to mth cell strings CS1_1 to CS1_m is coupled to a source select line SSL1.

For convenience of description, a structure of a cell string will be described based on the first cell string CS1_1 among the plurality of cell strings CS1_1 to CS1_m. However, it will be understood that each of the other cell strings CS1_2 to CS1_m is configured identically to the first cell string CS1_1.

A drain terminal of the drain select transistor DST included in the first cell string CS1_1 is coupled to the first bit line BL1. A source electrode of the drain select transistor DST included in the first cell string CS1_1 is coupled to a drain terminal of the first memory cell MC1 included in the first cell string CS1_1. The first to nth memory cells MC1 to MCn are coupled in series to each other. A drain terminal of the source select transistor SST included in the first cell string CS1_1 is coupled to a source terminal of the nth memory cell MCn included in the first cell string CS1_1. A source terminal of the source select transistor SST included in the first cell string CS1_1 is coupled to a common source line CSL. In an embodiment, the common source line CSL may be commonly coupled to the first to zth memory blocks BLK1 to BLKz.

The drain select line DSL1, the first to nth word lines WL1 to WLn, and the source select line SSL1 are included in the row lines RL shown in FIG. 2. The drain select line DSL1, the first to nth word lines WL1 to WLn, and the source select line SSL1 is controlled by the address decoder 121 shown in FIG. 2. The common source line CSL may be controlled by the control logic 130 shown in FIG. 2. The first to nth bit lines BL1 to BLm are controlled by the read/write circuit 123 shown in FIG. 2.

Figure 4:
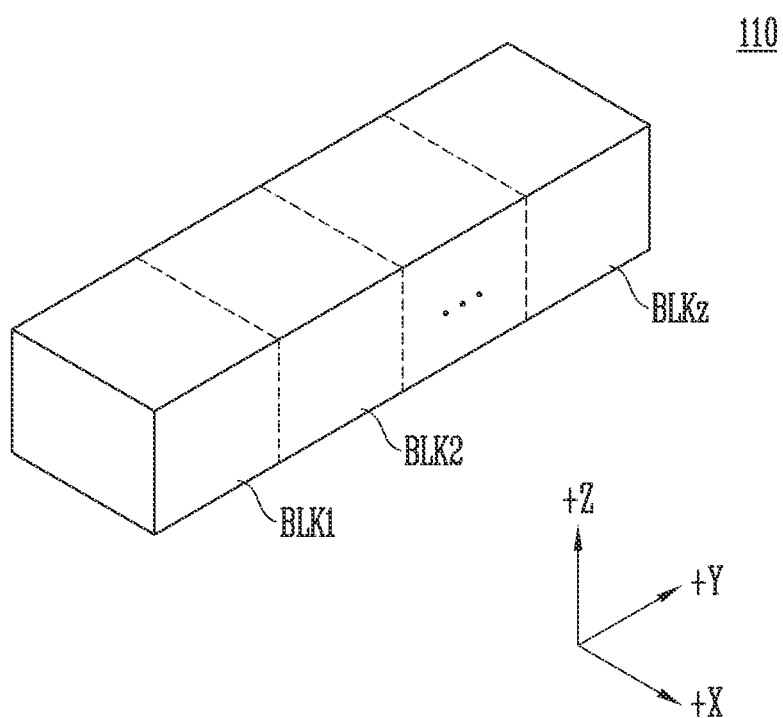
FIG. 4 is a diagram illustrating another embodiment of the memory cell array shown in FIG. 2.

FIG. 4 is a diagram illustrating another embodiment of the memory cell array shown in FIG. 2.

Referring to FIG. 4, the memory cell array 110 may include a plurality of memory blocks BLK1 to BLKz. Each memory block may have a three-dimensional structure. Each memory block may include a plurality of memory cells stacked on a substrate (not shown). The plurality of memory cells may be arranged along +X, +Y, and +Z directions. A structure of each memory block will be described in more detail with reference to FIGS. 5 and 6.

Figure 5:
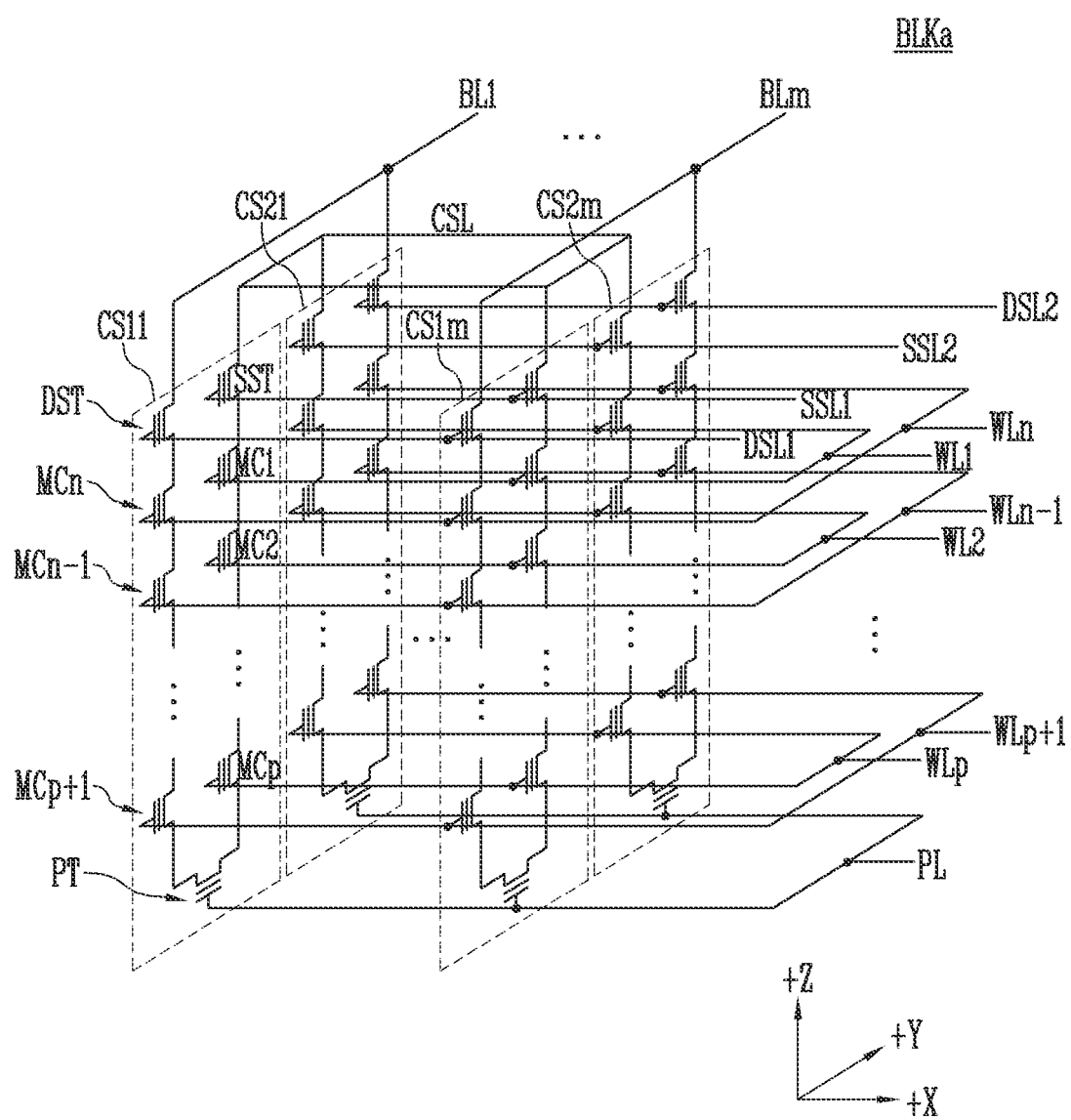
FIG. 5 is a circuit diagram illustrating any one memory block among memory blocks shown in FIG. 4.

FIG. 5 is a circuit diagram illustrating a memory block BLKa among the memory blocks BLK1 to BLKz shown in FIG. 4.

Referring to FIG. 5, the memory block BLKa may include a plurality of cell strings CS11 to CS1m and CS21 to CS2m. In an embodiment, each of the plurality of cell strings CS11 to CS1m and CS21 to CS2m may be formed in a 'U' shape. In the memory block BLKa, m cell strings are arranged in a row direction (i.e., a +X direction). FIG. 5 illustrates two cell strings arranged in a column direction (i.e., a +Y direction). However, this is for convenience of description, and it will be understood that three cell strings may be arranged in the column direction.

In an embodiment, one memory block may include a plurality of sub-blocks. One sub-block may include cell strings arranged in a 'U' shape on one column.

Each of the plurality of cell strings CS11 to CS1m and CS21 to CS2m may include at least one source select transistor SST, first to nth memory cells MC1 to MCn, a pipe transistor PT, and at least one drain select transistor DST.

The select transistors SST and DST and the memory cells MC1 to MCn may have structures similar to one another. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each cell string. In an embodiment, a pillar for providing at least one of the channel layer, the tunneling insulating layer, the charge storage layer, and the blocking insulating layer may be provided in each cell string.

The source select transistor SST of each cell string is coupled between a common source line CSL and memory cells MC1 to MCp.

In an embodiment, the source select transistors of cell strings arranged on the same row are coupled to a source select line extending in the row direction, and the source select transistors of cell strings arranged on different rows are coupled to different source select lines. In FIG. 5, the source select transistors of the cell strings CS11 to CS1m on a first row are coupled to a first source select line SSL1. The source select transistors of the cell strings CS21 to CS2m on a second row are coupled to a second source select line SSL2.

In another embodiment, the source select transistors of the cell strings CS11 to CS1m and CS21 to CS2m may be commonly coupled to one source select line.

The first to nth memory cells MC1 to MCn of each cell string are coupled between the source select transistor SST and the drain select transistor DST.

The first to nth memory cells MC1 to MCn may be divided into first to pth memory cells MC1 to MCp and a (p+1)th to nth memory cells MCp+1 to MCn. The first to pth memory cells MC1 to MCp are sequentially arranged in the opposite direction of a +Z direction, and are coupled in series between the source select transistor SST and the pipe transistor PT. The (p+1)th to nth memory cells MCp+1 to MCn are sequentially arranged in the +Z direction, and are coupled in series between the pipe transistor PT and the drain select transistor DST. The first to pth memory cells MC1 to MCp and the (p+1)th to nth memory cells MCp+1 to MCn are coupled through the pipe transistor PT. Gate electrodes of the first to nth memory cells MC1 to MCn of each cell string are coupled to first to nth word lines WL1 to WLn, respectively.

A gate of the pipe transistor PT of each cell string is coupled to a pipe line PL.

The drain select transistor DST of each cell string is coupled between a corresponding bit line and the memory cells MCp+1 to MCn. Cell strings arranged in the row direction are coupled to a drain select line extending in the row direction. The drain select transistors of the cell strings CS11 to CS1m on the first row are coupled to a first drain select line DSL1. The drain select transistors of the cell strings CS21 to CS2m on the second row are coupled to a second drain select line DSL2.

Cell strings arranged in the column direction are coupled to a bit line extending in the column direction. In FIG. 5, the cell strings CS11 and CS21 on a first column are coupled to a first bit line BL1. The cell strings CS1m and CS2m on an mth column are coupled to an mth bit line BLm.

Memory cells coupled to the same word line in the cell strings arranged in the row direction constitute one page. For example, memory cells coupled to the first word line WL1 in the cell strings CS11 to CS1m on the first row constitute one page. Memory cells coupled to the first word line WL1 in the cell strings CS21 to CS2m on the second row constitute another page. As any one of the drain select lines DSL1 and DSL2 is selected, cell strings arranged in one row direction may be selected. As any one of the word lines WL1 to WLn is selected, one page may be selected in the selected cell strings.

In another embodiment, even bit lines and odd bit lines may be provided instead of the first to mth bit lines BL1 to BLm. In addition, even-numbered cell strings among the cell strings CS11 to CS1m or CS21 to CS2m arranged in the row direction may be coupled to the even bit lines, respectively, and odd-numbered cell strings among the cell strings CS11 to CS1m or CS21 to CS2m arranged in the row direction may be coupled to the odd bit lines, respectively.

In an embodiment, at least one of the first to nth memory cells MC1 to MCn may be used as a dummy memory cell. For example, the at least one dummy memory cell may be provided to decrease an electric field between the source select transistor SST and the memory cells MC1 to MCp. Alternatively, the at least one dummy memory cell may be provided to decrease an electric field between the drain select transistor DST and the memory cells MCp+1 to MCn. When the number of dummy memory cells increases, the reliability of an operation of the memory block BLKa is improved. On the other hand, the size of the memory block BLKa increases. When the number of dummy memory cells decreases, the size of the memory block BLKa decreases. On the other hand, an operation of the memory block BLKa may be less reliable.

In order to efficiently control the at least one dummy memory cell, the dummy memory cells may have a required threshold voltage. Before or after an erase operation of the memory block BLKa, a program operation may be performed on all or some of the dummy memory cells. When an erase operation is performed after the program operation is performed, the threshold voltage of the dummy memory cells control a voltage applied to the dummy word lines coupled to the respective dummy memory cells, so that the dummy memory cells can have the required threshold voltage.

Figure 6:
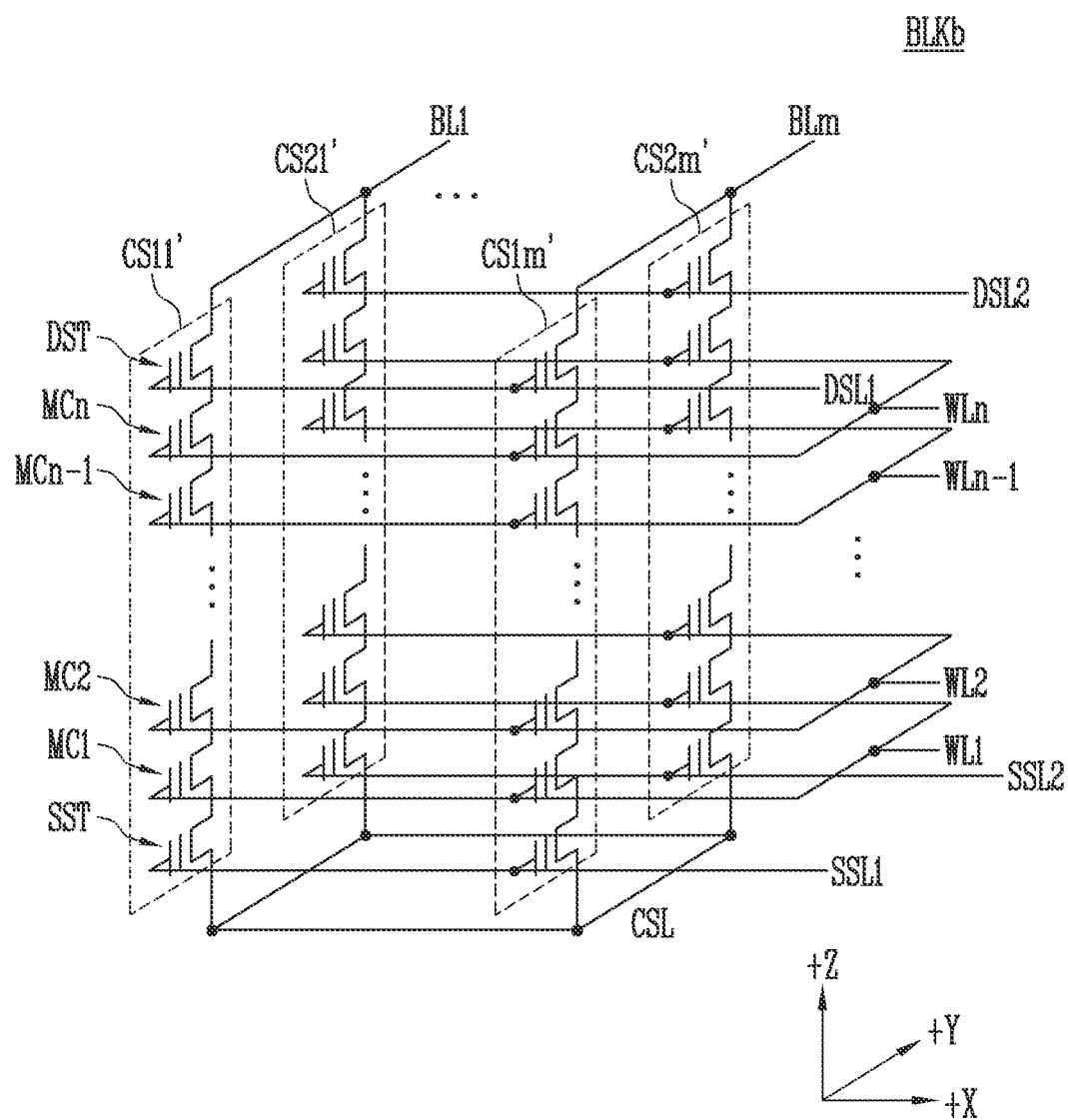
FIG. 6 is a circuit diagram illustrating another embodiment of the one memory block among the memory blocks shown in FIG. 4.

FIG. 6 is a circuit diagram illustrating another embodiment of a memory block BLKb among the memory blocks BLK1 to BLKz shown in FIG. 4.

Referring to FIG. 6, the memory block BLKb may include a plurality of cell strings CS11' to CS1m' and CS21' to CS2m'. Each of the plurality of cell strings CS11' to CS1m' and CS21' to CS2m' extends along the +Z direction. Each of the plurality of cell strings CS11' to CS1m' and CS21' to CS2m' includes at least one source select transistor SST, first to nth memory cells MC1 to MCn, and at least one drain select transistor DST, which are stacked on a substrate (not shown) under the memory block BLKb.

In an embodiment, one memory block may include a plurality of sub-blocks. One sub-block may include cell strings arranged in an 'I' shape on one column.

The source select transistor SST of each cell string is coupled between a common source line CSL and the memory cells MC1 to MCn. The source select transistors of cell strings arranged on the same row are coupled to the same source select line. The source select transistors of the cell strings CS11' to CS1m' arranged on a first row are coupled to a first source select line SSL1. Source select transistors of the cell strings CS21' to CS2m' arranged on a second row are coupled to a second source select line SSL2. In another embodiment, the source select transistors of the cell strings CS11' to CS1m' and CS21' to CS2m' may be commonly coupled to one source select line.

The first to nth memory cells MC1 to MCn of each cell string are coupled in series between the source select transistor SST and the drain select transistor DST. Gate electrodes of the first to nth memory cells MC1 to MCn are coupled to first to nth word lines WL1 to WLn, respectively.

The drain select transistor DST of each cell string is coupled between a corresponding bit line and the memory cells MC1 to MCn. The drain select transistors of cell strings arranged in the row direction are coupled to a drain select line extending in the row direction. The drain select transistors of the cell strings CS11' to CS1m' on the first row are coupled to a first drain select line DSL1. The drain select transistors of the cell strings CS21' to CS2m' on the second row are coupled to a second drain select line DSL2.

Consequently, the memory block BLKb of FIG. 6 has a circuit similar to that of the memory block BLKa of FIG. 5, except that the pipe transistor PT is excluded from each cell string in FIG. 6.

In another embodiment, even bit lines and odd bit lines may be provided instead of the first to mth bit lines BL1 to BLm. In addition, even-numbered cell strings among the cell strings CS11' to CS1m' or CS21' to CS2m' arranged in the row direction may be coupled to the even bit lines, respectively, and odd-numbered cell strings among the cell strings CS11' to CS1m' or CS21' to CS2m' arranged in the row direction may be coupled to the odd bit lines, respectively.

In an embodiment, at least one of the first to nth memory cells MC1 to MCn may be used as a dummy memory cell. For example, the at least one dummy memory cell may be provided to decrease an electric field between the source select transistor SST and the memory cells MC1 to MCp. Alternatively, the at least one dummy memory cell may be provided to decrease an electric field between the drain select transistor DST and the memory cells MCp+1 to MCn. When the number of dummy memory cells increases, the reliability of an operation of the memory block BLKb is improved. On the other hand, the size of the memory block BLKb is increased. When the number of dummy memory cells decreases, the size of the memory block BLKb decreases. On the other hand, an operation of the memory block BLKb may be less reliable.

In order to efficiently control the at least one dummy memory cell, the dummy memory cells may have a required threshold voltage. Before or after an erase operation of the memory block BLKb, a program operation may be performed on all or some of the dummy memory cells. When an erase operation is performed after the program operation is performed, the threshold voltage of the dummy memory cells control a voltage applied to the dummy word lines coupled to the respective dummy memory cells, so that the dummy memory cells can have the required threshold voltage.

Figure 7:
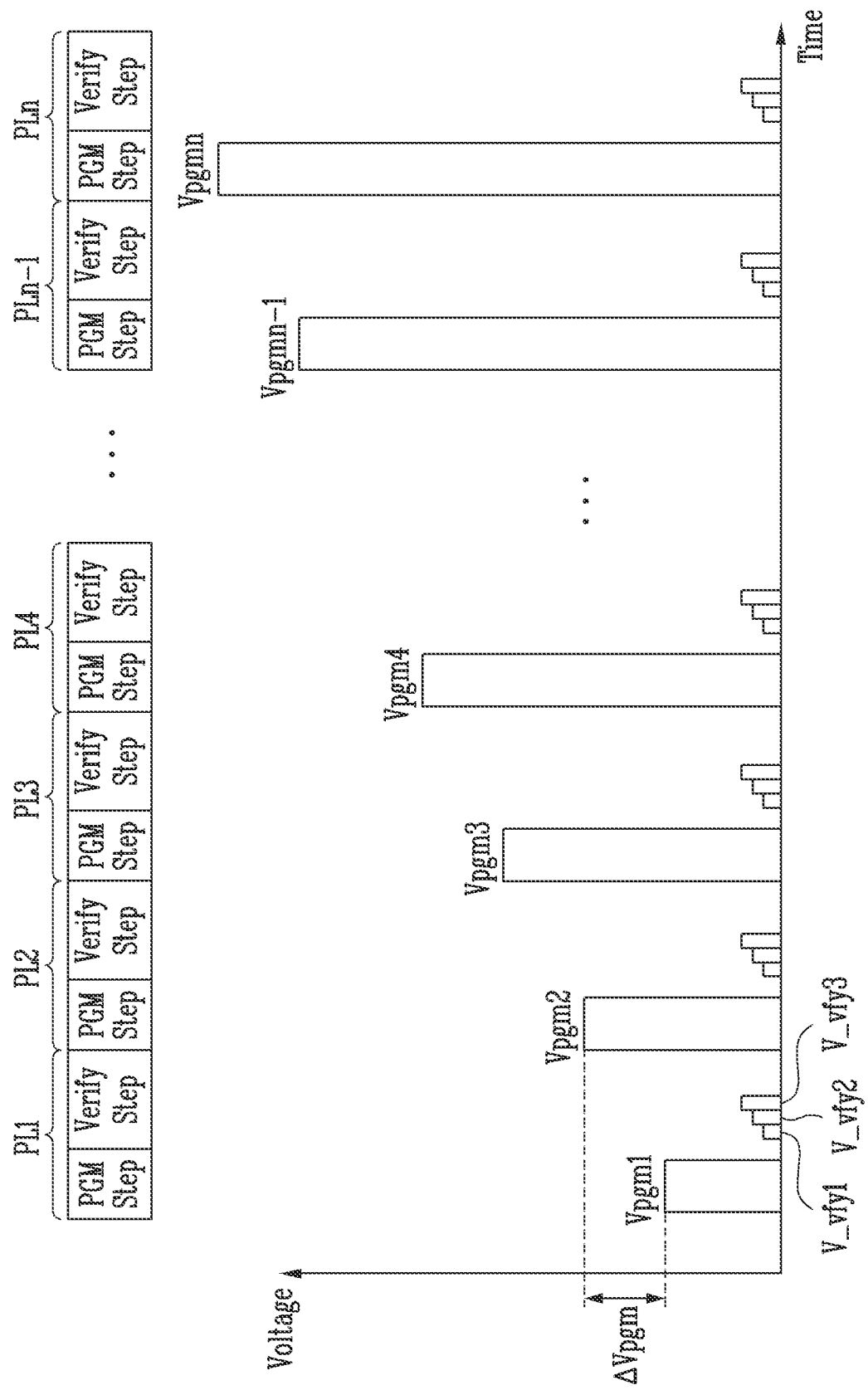
FIG. 7 is a diagram illustrating a program operation of the memory device shown in FIG. 2.

FIG. 7 is a diagram illustrating a program operation of the memory device 100 shown in FIG. 2.

In FIG. 7, for convenience of description, it is assumed that a memory cell is a Multi-Level Cell (MLC) storing 2-bit data. However, the scope of the present disclosure is not limited thereto, and the memory cell may be a Triple-Level Cell (TLC) storing 3-bit data or a Quadruple-Level Cell (QLC) storing 4-bit data. The number of data bits stored in the memory cell may be one or more.

The memory device 100 may program selected memory cells to have a threshold voltage corresponding to any one state among a plurality of program states P1, P2, and P3 by performing a plurality of program loops PL1 to PLn.

Each of the plurality of program loops PL1 to PLn may include a program voltage apply step PGM step of applying a program voltage to a selected word line coupled to the selected memory cells and a program verify step Verify Step of determining whether memory cells have been programmed by applying verify voltages.

For example, when a first program loop PL1 is performed, first to third verify voltages V_vfy1 to V_vfy3 are sequentially applied to verify a program state of the selected memory cells after a first program pulse Vpgm1 is applied. Memory cells of which a target program state is a first program state P1 may be verified by the first verify voltage V_vfy1, memory cells of which a target program state is a second program state P2 may be verified by the second verify voltage V_vfy2, and memory cells of which a target program state is a third program state P3 may be verified by the third verify voltage V_vfy3.

The memory cells verify-passed by each of the verify voltages V_vfy1 to V_vfy3 may be determined in that the memory cells have the target program state, and then be program-inhibited in a second program loop PL2. In other words, a program inhibit voltage may be applied to a bit line coupled to the verify-passed memory cells from the second program loop PL2.

A second program pulse Vpgm2 higher by a unit voltage ΔVpgm than the first program pulse Vpgm1 is applied to the selected word line so as to program the other memory cells except the program-inhibited memory cells in the second program loop PL2. Subsequently, a verify operation is performed identically to that of the first program loop PL1. For example, the term "verify-passed" means that a memory cell is read as an off-cell by a corresponding verify voltage.

As described above, when the memory device programs the MLC storing 2 bits, the memory device verify memory cells having program states as target program states respectively by using the first to third verify voltages V_vfy1 to V_vfy3.

In the verify operation, a verify voltage may be applied to the selected word line as a word line coupled to the selected memory cells, and the page buffer shown in FIG. 2 may determine whether the selected memory cells have been verify-passed, based on a current or voltage flowing through bit lines respectively coupled to the selected memory cells.

Figure 8:
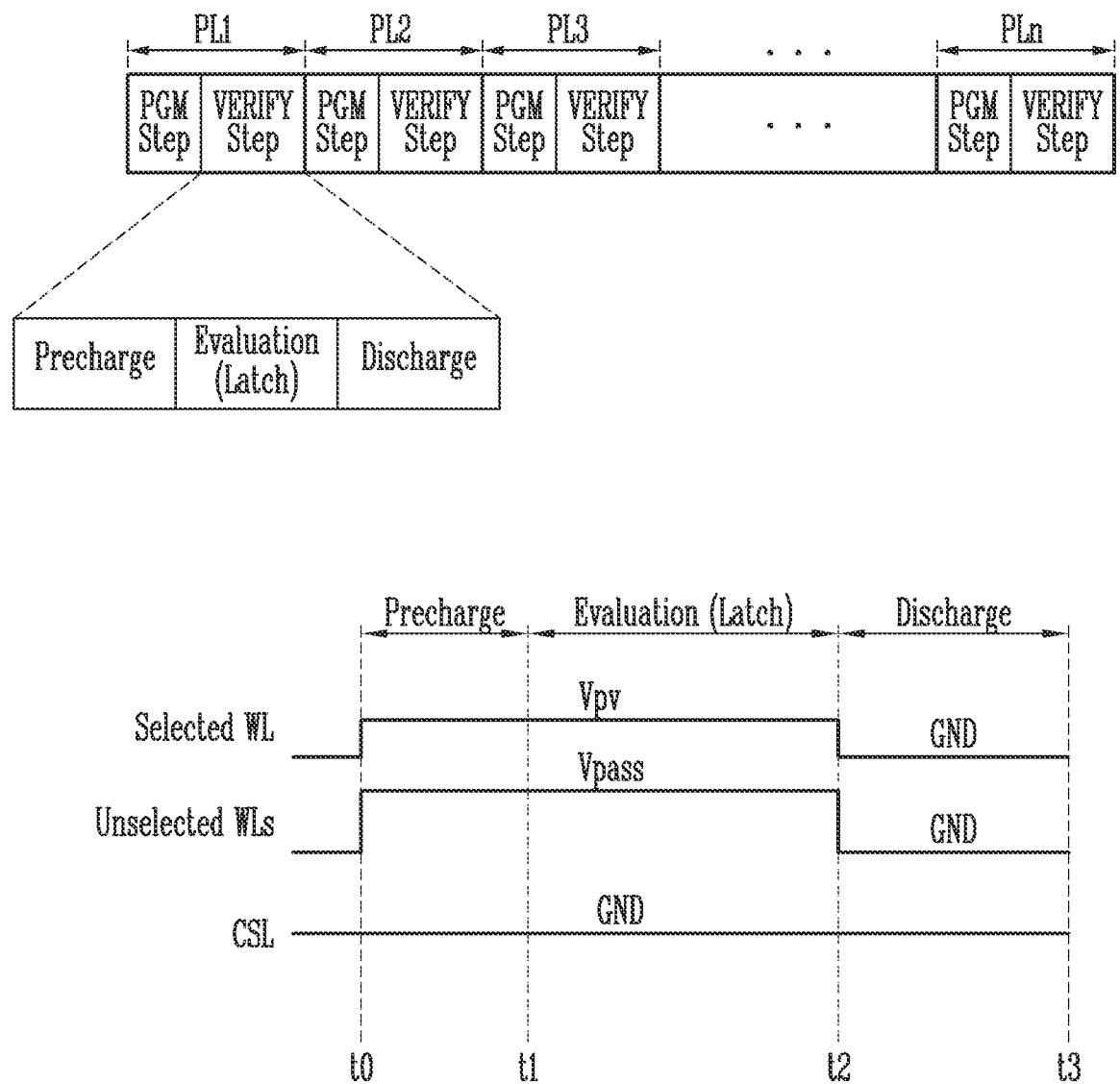
FIG. 8 is a diagram illustrating a program verify step shown in FIG. 7.

FIG. 8 is a diagram illustrating the program verify step shown in FIG. 7.

Referring to FIG. 8, a program operation of the memory device may include a plurality of program loops PL1 to PLn. That is, the memory device may program selected memory cells to have any one state among a plurality of program states by performing the plurality of program loops PL1 to PLn.

Each of the plurality of program loops PL1 to PLn may include a program voltage apply step PGM step of applying a program voltage to a selected word line coupled to the selected memory cells and a verify step Verify Step of determining whether the selected memory cells have been programmed by applying verify voltages Vpv to the selected word line.

The verify step included in each program bop may include a bit line precharge period, an evaluation period, and a discharge period.

In a period t0 to t2, a verify voltage Vpv corresponding to a program state to be verified is applied to a selected word line Selected WL. A verify pass voltage Vpass which allows memory cells coupled to an unselected word line Unselected WL to be turned on such that the memory cells have no influence on a voltage of a bit line may be applied to the unselected word line Unselected WL. A ground voltage corresponding to 0V may be applied to a common source line CSL.

The bit line precharge period t0 to t1 may be a period in which the memory device increases a potential of a bit line coupled to a memory cell through a sensing node coupled to the bit line.

The evaluation period t1 to t2 may be a period in which a voltage of a bit line BL, which is determined according to a current flowing through a memory cell, is sensed. The memory device may store a state of the memory cell according to the voltage of the bit line BL. The state of the memory cell may be a state corresponding to any one of verify pass or verify fail. When a threshold voltage of the memory cell is higher than the verify voltage Vpv applied to the word line, the memory cell may be read as an off-cell, and the memory cell read as the off-cell may correspond to a verify pass state. On the contrary, when the threshold voltage of the memory cell is lower than the verify voltage Vpv applied to the word line, the memory cell may be read as an on-cell, and the memory cell read as the on-cell may correspond to a verify fail state.

The discharge period t2 to t3 may be a period in which voltages applied to word lines and select lines (not shown) are discharged. The memory device may discharge the voltages applied to the word lines and the select lines (not shown) by applying the ground voltage corresponding to 0V to the word lines and the select lines (not shown).

Figure 9:
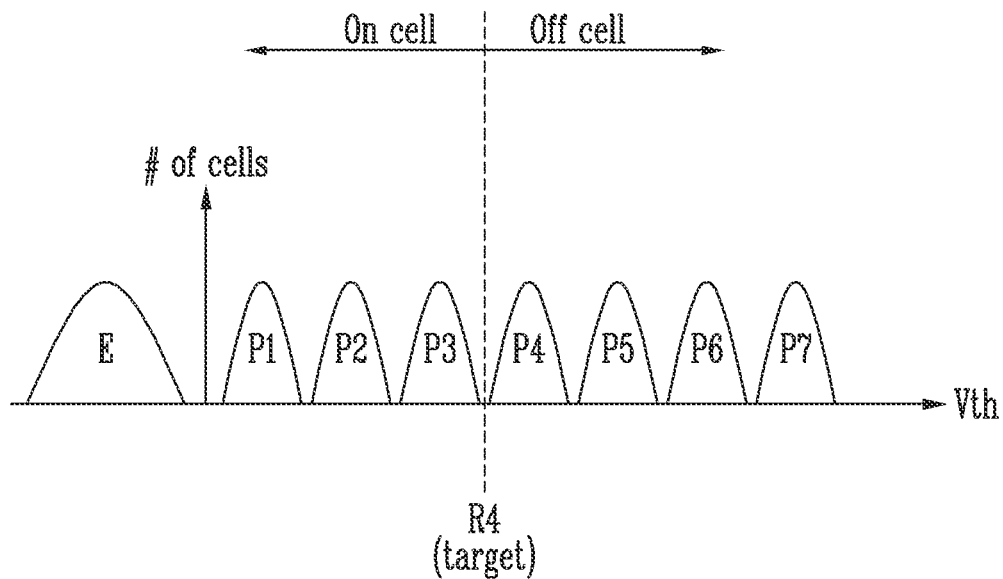
FIG. 9 is a diagram illustrating a read operation in accordance with an embodiment of the present disclosure.

FIG. 9 is a diagram illustrating a read operation in accordance with an embodiment of the present disclosure.

Referring to FIG. 9, each of the memory cells may be a triple-level cell storing 3 bits. The number of data bits which can be stored in the memory cell is not limited to this embodiment.

The memory cells may be programmed to any one state among an erase state E and first to seventh program states P1 to P7.

In FIG. 9, a read voltage R4 may be a voltage for distinguishing a threshold voltage distribution of the third program state P3 and a threshold voltage distribution of the fourth program state P4 from each other.

After a program operation on the memory cells is completed, the memory device may perform a read operation by applying the read voltage R4 to a word line coupled to the memory cells.

Memory cells which have the erase state or are programmed to the first to third program states P1 to P3 among the memory cells may be read as on-cells. Memory cells programmed to the fourth to seventh program states P4 to P7 among the memory cells may be read as off-cells.

For example, 800 memory cells may be equally programmed to any one state among the erase state E and the first to seventh program states P1 to P7, 100 memory cells may be included in a threshold voltage distribution corresponding to each state. When the read operation is performed by applying the read voltage R4 to the word line coupled to the memory cells, 400 memory cells may be read as on-cells.

Figure 10:
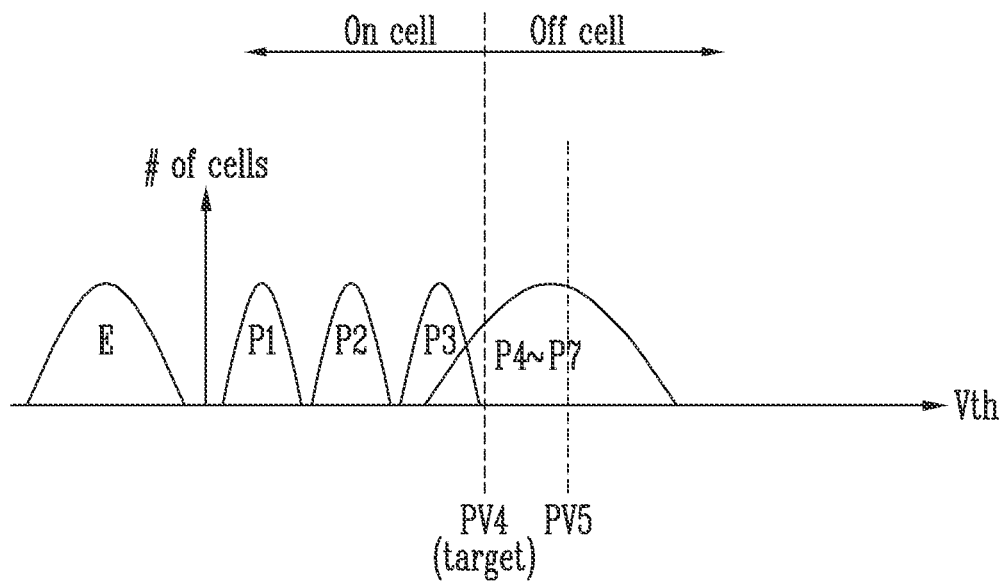
FIG. 10 is a diagram illustrating a program verify operation in accordance with an embodiment of the present disclosure.

FIG. 10 is a diagram illustrating a program verify operation in accordance with an embodiment of the present disclosure.

Referring to FIG. 10, each of memory cells may be a triple level cell storing 3 bits. The number of data bits which can be stored in the memory cell is not limited to this embodiment.

The memory cells may be programmed to have any one state among an erase state E and first to seventh program states P1 to P7. While a program operation is being performed, a threshold voltage distribution of the memory cells may be increased to a threshold voltage of a corresponding target program state, starting from the erase state E.

In FIG. 10, a program verify operation for the first to third program states P1 to P3 may be in a state in which the program verify operation has passed. A program verify operation for the fourth program state P4 may be in a state in which the program verify operation is being performed. The fourth program state P4 may be a target program state as a program state in which a program loop is being performed among the first to seventh program state P1 to P7.

In an embodiment, only a bit line coupled to memory cells to be programmed to the target program state among a plurality of memory cells may be precharged in the program verify operation for the target program state. Because only a bit line coupled to memory cells programmed to the fourth program state P4 is precharged, only some of the memory cells to be programmed to the fourth program state P4 may be read as on-cells, when a verify voltage PV4 is applied to a word line coupled to the plurality of memory cells.

For example, 800 memory cells may be equally distributed across program states among the erase state E and the first to seventh program states P1 to P7. 100 memory cells may be included in a threshold voltage distribution corresponding to a program state in which a program verify operation has passed.

When a program verify operation is performed by applying the verify voltage PV4 to a word line coupled to the memory cells, only some of 100 as the number of the memory cells to be programmed to the fourth program state P4 are read as on-cells.

Because only a bit line coupled to memory cells programmed to a target program state is precharged, a current consumption amount in a bit line precharge operation of the program verify operation is small. However, because a difference between numbers of on-cells in the read operation and the program verify operation, which are described with reference to FIG. 9 is a minimum of 300 or more, noise may exist, which occurs due to a mismatch of the numbers of on-cells between the read operation and the program verify operation. This is because memory cells to be programmed to the erase state E and the first to third program states P1 to P3, of which the program verify operation has already passed, are read as on-cells in the case of the read operation, but memory cells to be programmed to the erase state E and the first to third program states P1 to P3 instead of the target program state are read as off-cells in the case of the program verify operation.

In an embodiment, all bit lines coupled to the plurality of memory cells may be precharged in the program verify operation for the target program state. Because all the bit lines coupled to the plurality of memory cells are precharged, memory cells to be programmed to the erase state E and the first to third program states P1 to P3 may be read as on-cells, when the verify voltage PV4 is applied to the word line coupled to the plurality of memory cells. Some of memory cells to be programmed to the fourth to seventh program states P4 to P7 may be read as on-cells. Therefore, the number of on-cells may be a value obtained by adding 400 as a number of the memory cells to be programmed to the erase state E and the first to third program states P1 to P3 and a number of the some of the memory cells to be programmed to the fourth to seventh program states P4 to P7.

Because the difference between numbers of on-cells in the read operation and the program verify operation, which are described with reference to FIG. 9, corresponds to the number of the some of the memory cells to be programmed to the fourth to seventh program states P4 to P7, the noise occurring due to the mismatch of the numbers of on-cells between the read operation and the program verify operation can be decreased.

This is because, due to all the bit lines coupled to the plurality of memory cells being precharged, the memory cells to be programmed to the erase state E and the first to third program states P1 to P3, of which the program verify operation has already passed, are read as on-cells in both the read operation and the program verify operation. However, because all the bit lines coupled to the memory cells are precharged, the current consumption amount may be increased.

In an embodiment, in the program verify operation for the target program state, a bit line coupled to program-passed memory cells among memory cells to be programmed to a program state higher than the target program state may be precharged. A bit line coupled to memory cells to be programmed to a state lower than or equal to the target program state may be precharged. In an embodiment, all bit lines coupled to memory cells to be programmed to the target program state may be precharged. The memory cells to be programmed to the target program state may include both a program-failed memory cell and a program-passed memory cell. In another embodiment, a bit line coupled to the program-failed memory cell among the memory cells to be programmed to the target program state may be precharged.

For example, a bit line coupled to memory cells which have already program-passed among memory cells to be programmed to the fifth to seventh program states P5 to P7, which are higher than the target program state, may be precharged. A bit line coupled to memory cells to be programmed to the erase state E and the first to fourth program states P1 to P4 may be precharged.

That is, a bit line coupled to memory cells which have not program-passed among the memory cells to be programmed to the fifth to seventh program states P5 to P7, which are higher than the target program state, is not precharged, so that the current consumption amount can be decreased as compared with when all the bit lines coupled to the memory cells are precharged. In addition, the bit line coupled to the memory cells to be programmed to the erase state E and the first to fourth program states P1 to P4 is precharged, so that memory cells to be programmed to a program state in which the program verify operation has passed can be read as on-cells. Thus, the noise occurring due to the difference between the numbers of on-cells in the read operation and the program verify operation can be reduced or minimized.

In an embodiment, in the program verify operation for the target program state, a bit line coupled to program-passed memory cells among memory cells to be programmed to the other program states except the target program state may be precharged. A bit line coupled to memory cells to be programmed to the target program state may be precharged. In an embodiment, all bit lines coupled to memory cells to be programmed to the target program state may be precharged. The memory cells to be programmed to the target program state may include both a program-failed memory cell and a program-passed memory cell. In another embodiment, a bit line coupled to the program-failed memory cell among the memory cells to be programmed to the target program state may be precharged.

For example, a bit line coupled to memory cells which have already program-passed among memory cells to be programmed to the erase state E, the first to third program states P1 to P3, and the fifth to seventh program states P5 to P7 except the target program state may be precharged. A bit line coupled to memory cells to be programmed to the fourth program state P4 as the target program state may be precharged.

That is, a bit line coupled to memory cells which have not program-passed among the memory cells to be programmed to the other program states except the target program state is not precharged, so that the current consumption amount can be decreased as compared with when all the bit lines coupled to the memory cells are precharged. In addition, a bit line coupled to program-passed memory cells among the memory cells to be programmed to the other program states except the target program state is precharged, so that the program-passed memory cells can be read as on-cells. Thus, the noise occurring due to the difference between the numbers of on-cells in the read operation and the program verify operation can be reduced or minimized.

Figure 11:
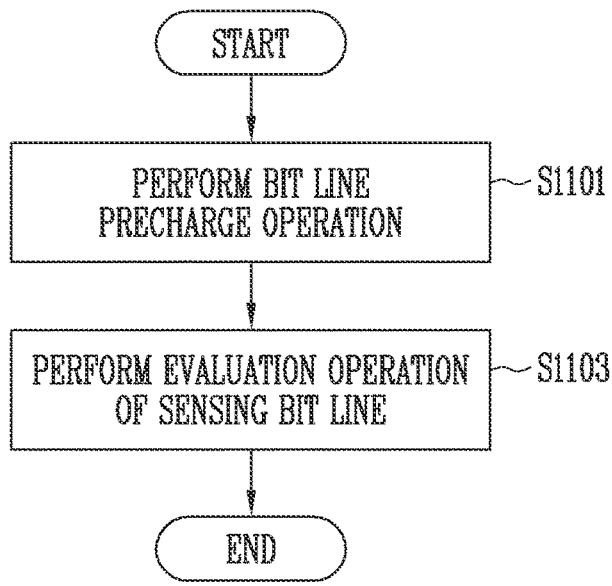
FIG. 11 is a flowchart illustrating an operation of a memory device in accordance with an embodiment of the present disclosure.

FIG. 11 is a flowchart illustrating an operation of a memory device, such as the memory device 100, in accordance with an embodiment of the present disclosure.

Referring to FIG. 11, in step S1101, the memory device may perform a bit line precharge operation. The bit line precharge operation may be an operation of increasing a potential of a bit line coupled to a memory cell to a constant level.

In step S1103, the memory device may perform an evaluation operation of sensing a potential of the bit line coupled to the memory cell.

The evaluation operation may be an operation of sensing a potential of the bit line, which is determined according to a current flowing through the memory cell. The current flowing through the memory cell may be determined based on a state of the memory cell. The state of the memory cell may correspond to any one of verify pass or verify fail. When a threshold voltage of the memory cell is higher than a verify voltage applied to a word line, the memory cell may be read as an off-cell, and the memory cell read as the off-cell may correspond to verify pass. On the contrary, when the threshold voltage of the memory cell is lower than the verify voltage applied to the word line, the memory cell may be read as an on-cell, and the memory cell read as the on-cell may correspond to verify fail.

Figure 12:
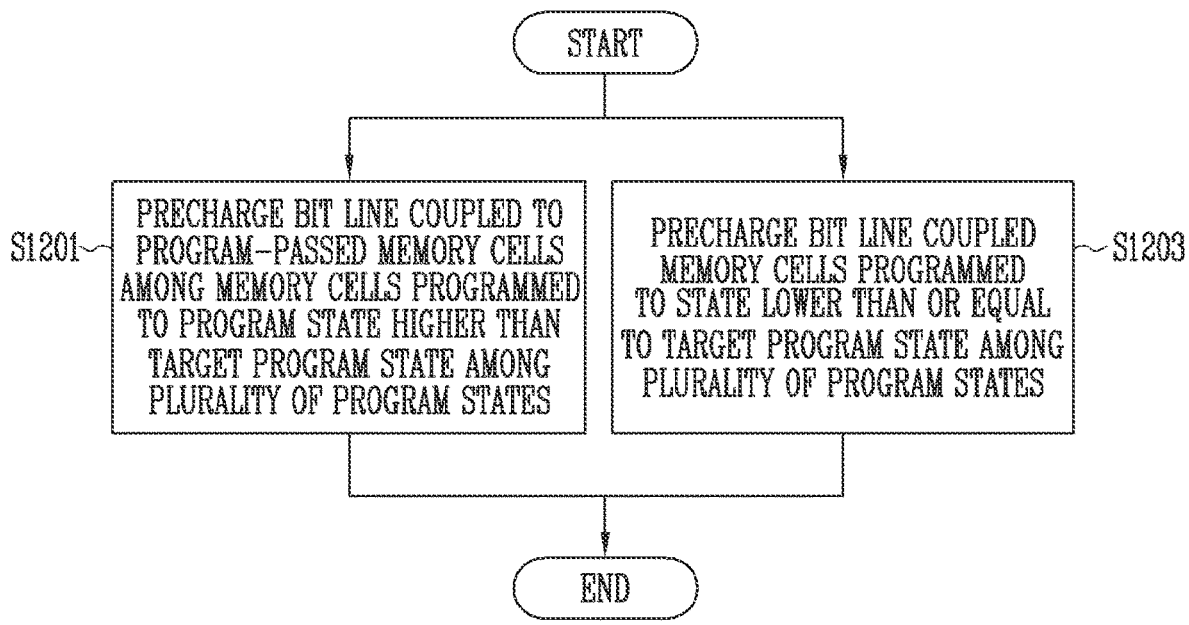
FIG. 12 is a flowchart illustrating an embodiment of a bit line precharge operation shown in FIG. 11.

FIG. 12 is a flowchart illustrating an embodiment of the bit line precharge operation shown in FIG. 11.

Referring to FIG. 12, in step S1201, the memory device may precharge a bit line coupled to program-passed memory cells among memory cells programmed to a program state higher than a target program state among a plurality of program states.

In step S1203, the memory device may precharge a bit line coupled to memory cells programmed to a state lower than or equal to the target program state among the plurality of program states.

FIG. 13 is a flowchart illustrating an embodiment of the bit line precharge operation shown in FIG. 11.

Referring to FIG. 13, in step S1301, the memory device may precharge a bit line coupled to program-passed memory cells among memory cells programmed to a program state higher than a target program state among a plurality of program states.

In step S1303, the memory device may precharge a bit line coupled to memory cells programmed to the target program state.

In accordance with the present disclosure, there can be provided a memory device having improved program verify operation performance and an operating method of the memory device.

While the present disclosure has been shown and described using a limited number of possible embodiments, it will be understood by those skilled in the art that various changes in form and detail may be made therein without departing from the spirit and scope of the present disclosure as defined by the appended claims and their equivalents. Therefore, the scope of the present disclosure should not be limited to the above-described embodiments but should be determined by not only the appended claims but also the equivalents thereof.

In the above-described embodiments, all steps may be selectively performed and some steps and may be omitted. In each embodiment, the steps are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made on the basis of the technological scope of the present disclosure.

Meanwhile, embodiments of the present disclosure have been described in the drawings and specification. Although specific terminologies are used here, those are only to explain the described embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

What is claimed is:

1. A memory device comprising:
 a plurality of memory cells;
 a peripheral circuit configured to perform a program verify operation for a target program state among a plurality of program states on selected memory cells among the plurality of memory cells; and
 control logic configured to control the peripheral circuit to precharge first bit lines coupled to first memory cells, and second bit lines coupled to second memory cells without precharging third bit lines coupled to third memory cells, among the selected memory cells, in the program verify operation,
 wherein the first memory cells are program-passed memory cells and the third memory cells are program-failed memory cells, among memory cells to be programmed to a program state having a higher threshold voltage than the target program state among the plurality of program states, and
 wherein the second memory cells are program-failed memory cells, among memory cells to be programmed to a program state having a lower threshold voltage than the target program state among the plurality of program states.

2. The memory device of claim 1,
wherein the control logic is configured to control the peripheral circuit to perform an evaluation operation of sensing a potential of each of bit lines coupled to the selected memory cells, after the first bit lines and the second bit lines are precharged.

3. The memory device of claim 2,
wherein the control logic is configured to control the peripheral circuit to apply a verify voltage to a word line coupled to the selected memory cells and to apply a verify pass voltage to word lines coupled to unselected memory cells among the plurality of memory cells, during the evaluation operation.

4. The memory device of claim 3,
wherein the control logic is configured to compare a threshold voltage of each of the memory cells to be programmed to the target program state among the selected memory cells with the verify voltage, based on a result of the evaluation operation, and determine whether the program verify operation for the target program state has passed or failed, based on a comparison result.

5. A memory device comprising:
a plurality of memory cells;
a peripheral circuit configured to perform a program verify operation for a target program state among a plurality of program states on selected memory cells among the plurality of memory cells; and
control logic configured to control the peripheral circuit to precharge first bit lines coupled to first memory cells and second bit lines coupled to second memory cells without precharging third bit lines coupled to third memory cells, among the selected memory cells, in the program verify operation,
wherein the first memory cells are program-passed memory cells among memory cells to be programmed to the other program states except the target program state among the plurality of program states,
wherein the second memory cells are memory cells to be programmed to the target program state,
wherein the third memory cells are program-failed memory cells among memory cells to be programmed to a program state having a higher threshold voltage than the target program state among the plurality of program states, and
wherein the control logic is configured to control the peripheral circuit to precharge fourth bit lines coupled to program-failed memory cells among memory cells to be programmed to a program state having a lower threshold voltage than the target program state, included in the selected memory cells, in the program verify operation.

6. The memory device of claim 5,
wherein the control logic is configured to control the peripheral circuit to perform an evaluation operation of sensing a potential of each of bit lines coupled to the selected memory cells, after the first bit lines and the second bit lines are precharged.

7. The memory device of claim 6,
wherein the control logic is configured to control the peripheral circuit to apply a verify voltage to a word line coupled to the selected memory cells and to apply a verify pass voltage to word lines coupled to unselected memory cells among the plurality of memory cells, during the evaluation operation.

8. The memory device of claim 7,
wherein the control logic is configured to compare a threshold voltage of each of the memory cells to be programmed to the target program state among the selected memory cells with the verify voltage, based on a result of the evaluation operation, and determine whether the program verify operation for the target program state has passed or failed, based on a comparison result.

9. A method for operating a memory device including a plurality of memory cells, the method comprising:
performing a bit line precharge operation of precharging first bit lines coupled to first memory cells and second bit lines coupled to second memory cells without precharging third bit lines coupled to third memory cells, included in selected memory cells among the plurality of memory cells; and
performing an evaluation operation of sensing a potential of each of bit lines coupled to the selected memory cells,
wherein the first memory cells are program-passed memory cells and the third memory cells are program-failed memory cells, among memory cells to be programmed to a program state having a higher threshold voltage than a target program state among a plurality of program states, and
wherein the second memory cells are program-failed memory cells, among memory cells to be programmed to a program state having a lower threshold voltage than the target program state among the plurality of program states.

10. The method of claim 9, wherein performing the evaluation operation includes:
applying a verify voltage to a word line coupled to the selected memory cells;
applying a verify pass voltage to word lines coupled to unselected memory cells among the plurality of memory cells; and
sensing the potential of each of the bit lines coupled to the selected memory cells.

11. The method of claim 10, further comprising:
comparing a threshold voltage of each of the memory cells to be programmed to the target program state among the selected memory cells with the verify voltage, based on a result of the evaluation operation; and
determining whether a program verify operation for the target program state has passed or failed, based on a comparison result.

12. A method for operating a memory device including a plurality of memory cells, the method comprising:
performing a bit line precharge operation of precharging first bit lines coupled to first memory cells and second bit lines coupled to second memory cells without precharging third bit lines coupled to third memory cells, included in selected memory cells among the plurality of memory cells; and
performing an evaluation operation of sensing a potential of each of bit lines coupled to the selected memory cells,
wherein the first memory cells are program-passed memory cells among memory cells to be programmed to the other program states except a target program state among a plurality of program states,
wherein the second memory cells are memory cells to be programmed to the target program state, and
wherein the third memory cells are program-failed memory cells among memory cells to be programmed to a program state having a higher threshold voltage than the target program state among the plurality of program states, and wherein performing the bit line precharge operation includes precharging fourth bit lines coupled to program-failed memory cells among memory cells to be programmed to a program state having a lower threshold voltage than the target program state, included in the selected memory cells.

13. The method of claim 12, wherein performing the evaluation operation includes:

applying a verify voltage to a word line coupled to the selected memory cells;

applying a verify pass voltage to word lines coupled to unselected memory cells among the plurality of memory cells; and sensing the potential of each of the bit lines coupled to the selected memory cells.

14. The method of claim 13, further comprising:

comparing a threshold voltage of each of the memory cells to be programmed to the target program state among the selected memory cells with the verify voltage, based on a result of the evaluation operation; and determining whether a program verify operation for the target program state has passed or failed, based on a comparison result.

* * * * *